(12) United States Patent
Pelli

(10) Patent No.: US 11,881,874 B2
(45) Date of Patent: Jan. 23, 2024

(54) MOTION SENSOR WITH SIGMA-DELTA ANALOG-TO-DIGITAL CONVERTER HAVING RESISTIVE CONTINUOUS-TIME DIGITAL-TO-ANALOG CONVERTER FEEDBACK FOR IMPROVED BIAS INSTABILITY

(71) Applicant: INVENSENSE, INC., San Jose, CA (US)

(72) Inventor: Gabriele Pelli, Mortara (IT)

(73) Assignee: INVENSENSE, INC., San Jose, CA (US)

( * ) Notice: Subject to any disclaimer, the term of this patent is extended or adjusted under 35 U.S.C. 154(b) by 28 days.

(21) Appl. No.: 17/674,788

(22) Filed: Feb. 17, 2022

(65) Prior Publication Data
US 2023/0261669 A1   Aug. 17, 2023

(51) Int. Cl.
| | |
|---|---|
| *H03M 3/00* | (2006.01) |
| *H03F 3/45* | (2006.01) |
| *G01C 19/5712* | (2012.01) |
| *G01P 1/00* | (2006.01) |
| *G01P 15/08* | (2006.01) |

(Continued)

(52) U.S. Cl.
CPC ........ *H03M 3/376* (2013.01); *G01C 19/5649* (2013.01); *G01C 19/5712* (2013.01); *G01C 19/5776* (2013.01); *G01P 1/00* (2013.01); *G01P 15/08* (2013.01); *H03F 3/45* (2013.01); *H03M 3/34* (2013.01); *H03M 3/458* (2013.01);

(Continued)

(58) Field of Classification Search
CPC ........ H03M 3/376; H03M 3/45; H03M 3/458; H03M 3/32; H03M 3/368; H03M 3/326; H03M 3/464; H03M 3/34; G01C 19/5649; G01C 19/5712; G01C 19/5776; G01P 15/08; G01P 1/00; H03F 3/45; H03F 3/45475

See application file for complete search history.

(56) References Cited

U.S. PATENT DOCUMENTS

| | | | | |
|---|---|---|---|---|
| 6,040,793 A | * | 3/2000 | Ferguson, Jr. .......... | H03M 3/44 341/172 |
| 6,538,588 B1 | * | 3/2003 | Bazarjani ................ | H03M 3/47 341/143 |

(Continued)

*Primary Examiner* — Helen C Kwok
(74) *Attorney, Agent, or Firm* — Amin, Turocy & Watson, LLP

(57) ABSTRACT

A motion sensor with sigma-delta analog-to-digital converter (ADC) having improved bias instability is presented herein. Differential outputs of a differential amplifier of the sigma-delta ADC are electrically coupled, via respective capacitances, to differential inputs of the differential amplifier. To minimize bias instability corresponding to flicker noise that has been injected into the differential inputs, the differential inputs are electrically coupled, via respective pairs of electronic switches, to feedback resistances based on a pair of switch control signals. In this regard, a first feedback resistance of the feedback resistances is electrically coupled to a first defined voltage, and a second feedback resistance of the feedback resistances is electrically coupled to a second defined reference voltage. The differential outputs are electrically coupled to differential inputs of a differential comparator of the sigma-delta ADC, and complementary outputs of the differential comparator comprise the pair of switch control signals.

20 Claims, 10 Drawing Sheets

(51) Int. Cl.
*G01C 19/5776* (2012.01)
*G01C 19/5649* (2012.01)
(52) U.S. Cl.
CPC ... *H03M 3/464* (2013.01); *H03F 2203/45151* (2013.01); *H03F 2203/45546* (2013.01)

(56) References Cited

U.S. PATENT DOCUMENTS

| | | | | |
|---|---|---|---|---|
| 7,009,541 | B1* | 3/2006 | Nguyen | H03M 3/356 |
| | | | | 341/120 |
| 8,665,130 | B2* | 3/2014 | Makinwa | H03M 1/14 |
| | | | | 341/155 |
| 9,787,291 | B1* | 10/2017 | Reindl | H03H 19/004 |
| 10,833,698 | B1* | 11/2020 | Oliaei | H03M 3/464 |
| 11,545,996 | B1* | 1/2023 | Maurino | H03M 1/363 |
| 2009/0079607 | A1* | 3/2009 | Denison | A61B 5/316 |
| | | | | 341/166 |
| 2010/0013688 | A1* | 1/2010 | Murakami | H03M 3/368 |
| | | | | 341/143 |
| 2010/0194615 | A1* | 8/2010 | Lu | H03M 3/454 |
| | | | | 341/155 |
| 2011/0175761 | A1* | 7/2011 | Zare-Hoseini | H03M 3/32 |
| | | | | 341/143 |
| 2021/0011066 | A1* | 1/2021 | Maccioni | H03M 3/30 |
| 2021/0293843 | A1* | 9/2021 | Valli | H03M 3/458 |

* cited by examiner

MOTION SENSOR WITH SIGMA-DELTA ANALOG-TO-DIGITAL CONVERTER HAVING RESISTIVE CONTINUOUS-TIME DIGITAL-TO-ANALOG CONVERTER FEEDBACK FOR IMPROVED BIAS INSTABILITY

TECHNICAL FIELD

The subject disclosure generally relates to embodiments for a motion sensor with sigma-delta analog-to-digital converter (ADC) having resistive continuous-time digital-to-analog converter (DAC) feedback for improved bias instability.

BACKGROUND

A key building block of many devices, e.g., sensor devices, micro-electromechanical system (MEMS) based sensor devices) is the ADC, e.g., sigma-delta ADC. Feedback resistors used in feedback loops of a sigma-delta ADC incur flicker noise, e.g., slow (in time) and small (in value) variations in resistance values of the feedback resistors. Such variations lead to slow and small changes in respective currents that are injected, via a DAC of the sigma-delta ADC, into the feedback loops around nominal current values—the injected currents increasing bias instability of the sigma-delta ADC. In this regard, conventional sensor technologies have had some drawbacks, some of which may be noted with reference to the various embodiments described herein below.

BRIEF DESCRIPTION OF THE DRAWINGS

Non-limiting embodiments of the subject disclosure are described with reference to the following Figures, wherein like reference numerals refer to like parts throughout the various views unless otherwise specified.

DETAILED DESCRIPTION

Figure 1:
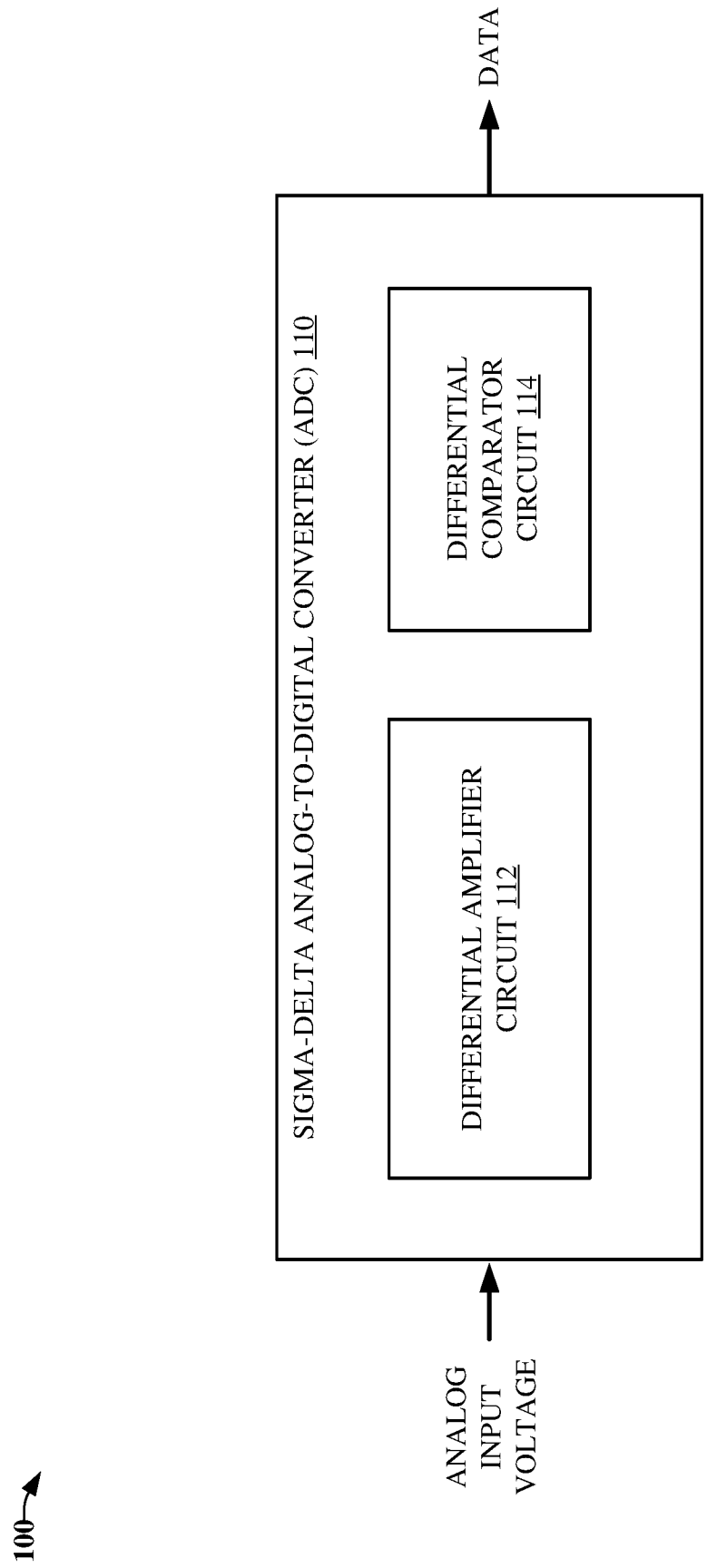
FIG. 1 illustrates a block diagram of a sigma-delta ADC having resistive continuous-time DAC feedback for improved bias instability, in accordance with various example embodiments.

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

As described above, flicker noise increases bias instability of sigma-delta ADCs. On the other hand, various embodiments disclosed herein can significantly reduce bias instability of a sigma-delta ADC by equally distributing flicker noise that has been injected into differential inputs of the sigma-delta ADC.

For example, in embodiment(s), a sigma-delta ADC comprises a differential amplifier circuit comprising a differential amplifier, and a differential comparator circuit comprising a differential comparator. The differential amplifier comprises respective differential amplifier inputs and respective differential amplifier outputs. The respective differential amplifier outputs are electrically coupled, via respective capacitances, to the respective differential amplifier inputs, and the respective differential amplifier inputs are electrically coupled, via respective pairs of electronic switches, to respective feedback resistances based on a pair of switch control signals.

The differential comparator comprises differential comparator inputs and complementary comparator outputs, in which the complementary comparator outputs comprise the pair of switch control signals. In this regard, the sigma-delta ADC minimizes bias instability corresponding to flicker noise, e.g., which has been injected into the respective differential amplifier inputs via the respective feedback resistances, by electrically coupling, based on the pair of switch control signals, a first feedback resistance of the respective feedback resistances to a first defined reference voltage (e.g., 0 volts), and electrically coupling a second feedback resistance of the respective feedback resistances to a second defined reference voltage (e.g., greater than 0 volts).

In embodiment(s), bias instability of the sigma-delta ADC is measured when a differential analog input voltage equal to 0 V is applied to the respective differential amplifier inputs. Under such conditions, the pair of switch control signals comprise respective square-waves that are 180 degrees (or within a defined accuracy of 180 degrees), are out of phase with each other, and have a defined frequency (e.g., orders of magnitude less than a clock frequency of the sigma-delta ADC) and a defined duty cycle that is within a defined accuracy (e.g., 2-5%) of a 50% duty cycle.

In other embodiment(s), an accelerometer comprises: a MEMS sensor that generates sensor output signals based on an external acceleration that has been applied to the accelerometer, and a sigma-delta ADC that comprises: respective ADC input resistances; a differential amplifier comprising respective differential amplifier inputs and respective differential amplifier outputs; and a differential comparator comprising differential comparator inputs and complementary comparator outputs comprising a pair of switch control signals.

In this regard, the sensor output signals are electrically coupled, via the respective ADC input resistances, to the respective differential amplifier inputs; the respective differential amplifier outputs are electrically coupled to the differential comparator inputs; and the respective differential amplifier outputs are electrically coupled, via respective capacitances, to the respective differential amplifier inputs.

Further, the respective differential amplifier inputs are electrically coupled, via respective pairs of electronic switches, to respective feedback resistances based on the pair of switch control signals. In turn, a first feedback resistance of the respective feedback resistances is electrically coupled to a first defined reference voltage, and a second feedback resistance of the respective feedback resistances is electrically coupled to a second defined reference voltage.

In embodiment(s), bias instability of the sigma-delta ADC is measured when a differential analog input voltage equal to 0 V is applied to the respective differential amplifier inputs. Under such conditions, the pair of switch control signals comprise respective square waves that are 180 degrees (or within a defined accuracy of 180 degrees), are out of phase with each other, and have a defined frequency (e.g., orders of magnitude less than a clock frequency of the sigma-delta ADC) and a defined duty cycle that is within a defined accuracy (e.g., 2-5%) of a 50% duty cycle.

In yet other embodiment(s), a gyroscope comprises: a MEMS sensor that generates sensor output signals based on an external rotation that has been applied to the gyroscope, and a sigma-delta ADC that comprises: respective ADC input resistances; a differential amplifier comprising respective differential amplifier inputs and respective differential amplifier outputs; and a differential comparator comprising differential comparator inputs and complementary comparator outputs comprising a pair of switch control signals.

In this regard, the sensor output signals are electrically coupled, via the respective ADC input resistances, to the respective differential amplifier inputs; the respective differential amplifier outputs are electrically coupled to the differential comparator inputs; and the respective differential amplifier outputs are electrically coupled, via respective capacitances, to the respective differential amplifier inputs.

Further, the respective differential amplifier inputs are electrically coupled, via respective pairs of electronic switches, to respective feedback resistances based on the pair of switch control signals to minimize bias instability corresponding to flicker noise that has been injected into the respective differential amplifier inputs by the respective feedback resistances. In this regard, a first feedback resistance of the respective feedback resistances is electrically coupled to a first defined reference voltage (e.g., 0 V), and a second feedback resistance of the respective resistances is electrically coupled to a second defined reference voltage (e.g., greater than 0 V).

In embodiment(s), bias instability of the sigma-delta ADC is measured when a differential analog input voltage equal to 0 V is applied to the respective differential amplifier inputs. Under such conditions, the pair of switch control signals comprise respective square waves that are 180 degrees (or within a defined accuracy of 180 degrees), are out of phase with each other, and have a defined frequency (e.g., orders of magnitude less than an clock frequency of the sigma-delta ADC) and a defined duty cycle that is within a defined accuracy (e.g., 2-5%) of a 50% duty cycle.

In yet other embodiment(s), a system comprises: a MEMS sensor that generates sensor output signals based on an external excitation of the system, and a sigma-delta ADC that comprises: respective ADC input resistances; a differential amplifier comprising respective differential amplifier inputs and respective differential amplifier outputs; and a differential comparator comprising differential comparator inputs and complementary comparator outputs comprising a pair of switch control signals.

In this regard, the sensor output signals are electrically coupled, via the respective ADC input resistances, to the respective differential amplifier inputs; the respective differential amplifier outputs are electrically coupled to the differential comparator inputs; and the respective differential amplifier outputs are electrically coupled, via respective capacitances, to the respective differential amplifier inputs.

Further, the respective differential amplifier inputs are electrically coupled, via respective pairs of electronic switches, to respective feedback resistances based on the pair of switch control signals. In turn, a first feedback resistance of the respective feedback resistances is electrically coupled to a first defined reference voltage, and a second feedback resistance of the respective feedback resistances is electrically coupled to a second defined reference voltage.

In embodiment(s), bias instability of the sigma-delta ADC is measured when a differential analog input voltage equal to 0 V is applied to the respective differential amplifier inputs. Under such conditions, the pair of switch control signals comprise respective square waves that are 180 degrees (or within a defined accuracy of 180 degrees), are out of phase with each other, and have a defined frequency (e.g., orders of magnitude less than an clock frequency of the sigma-delta ADC) and a defined duty cycle that is within a defined accuracy (e.g., 2-5%) of a 50% duty cycle.

Various embodiments disclosed herein reduce bias instability of a sigma-delta ADC by equally distributing flicker noise, which has been injected via feedback resistances into differential inputs of the sigma-delta ADC, by electrically coupling, via respective pairs of electronic switches, the sigma delta ADC inputs to the feedback resistances based on the pair of switch control signals.

Figure 2:
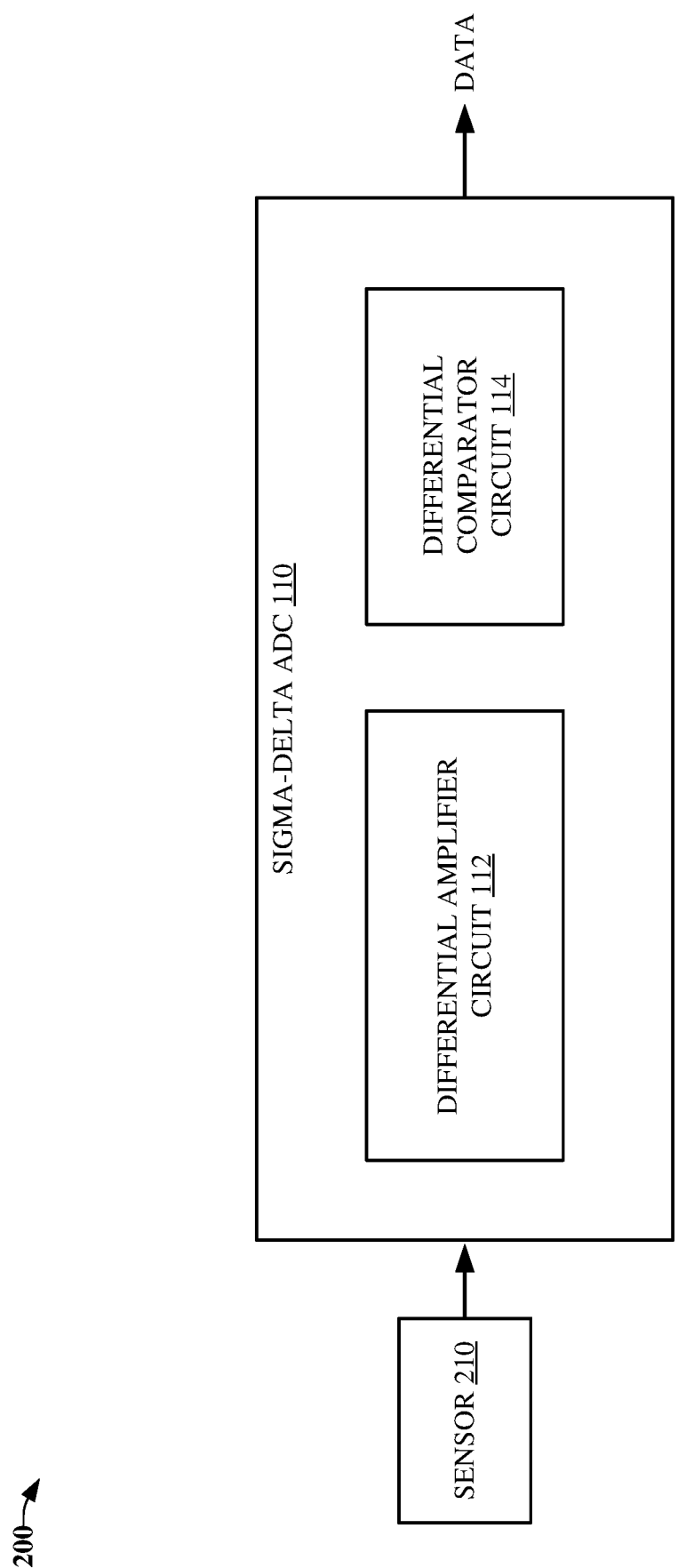
FIG. 2 illustrates a block diagram of a motion sensor-based system utilizing a sensor that is electrically coupled to a sigma-delta ADC having resistive continuous-time DAC feedback for improved bias instability, in accordance with various example embodiments.
Figure 3:
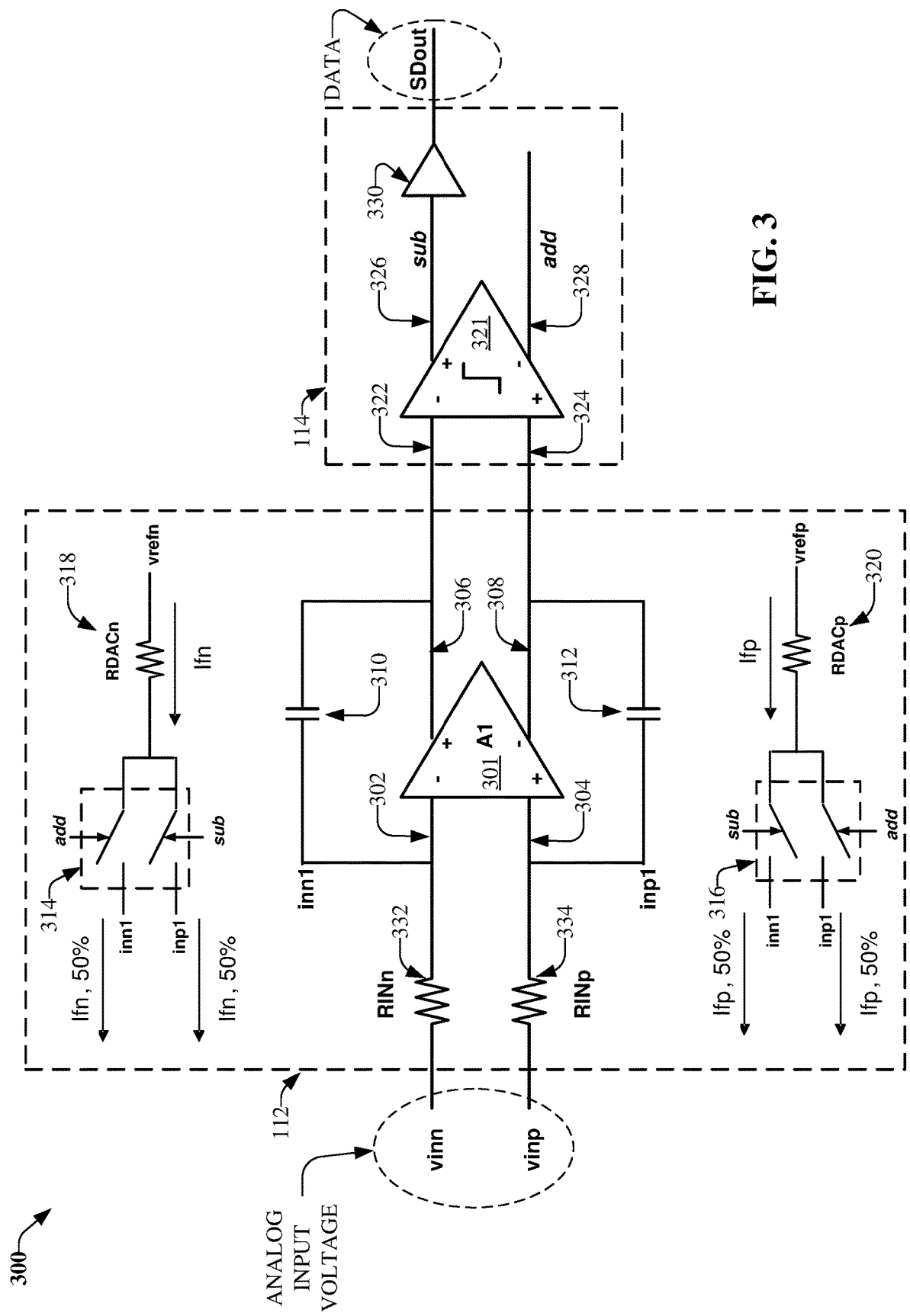
FIG. 3 illustrates a block diagram of a circuit comprising a sigma-delta ADC having resistive continuous-time DAC feedback for improved bias instability, in accordance with various example embodiments.

Now referring to FIGS. 1-3, block diagrams (100, 200, 300) of a sigma-delta ADC (110) having resistive continuous-time DAC feedback for improved bias instability, a motion sensor-based system utilizing a sensor that is electrically coupled to the sigma-delta ADC, and a circuit comprising the sigma-delta ADC are illustrated, respectively, in accordance with various example embodiments.

The sigma-delta ADC generates, based on an analog input voltage, e.g., generated by a sensor (210) (e.g., motion sensor, MEMS sensor, MEMS based capacitive sensor (e.g., accelerometer based sensor), MEMS based angular rate sensor (e.g., gyroscope based sensor)), a digital output ("DATA") representing a value of the analog input voltage, e.g., representing an acceleration of a system and/or a device including the sigma-delta ADC, representing an angular rotation of the system and/or the device. It should be appreciated by a person of ordinary skill in the art of ADC circuit design having the benefit of the instant disclosure that sigma-delta ADC embodiments disclosed herein can be readily integrated with other ADC device(s), circuit(s), signal(s), modulator(s), filter(s), clock generator(s), clock(s), interface circuit(s), control circuit(s), processing device(s) (all not shown) to affect further operation of the subject embodiments in regards to generating, e.g., based on the digital output, system level data representing external excitation(s) and/or force(s) that have been applied to system(s) (e.g., a MEMS based system (see FIG. 8), an accelerometer (see FIG. 9), a gyroscope (see FIG. 10)) that include the sigma-delta ADC embodiments disclosed herein.

In embodiment(s), the sigma-delta ADC (110) includes a differential amplifier circuit (112) that includes a differential amplifier (301) and a differential comparator circuit (114) that includes a differential comparator (321). A differential analog input voltage ("vinn" and "vinp") is input to the sigma-delta ADC and electrically coupled, via respective ADC input resistances (332, 334), to respective differential amplifier inputs (302, 304) of the differential amplifier.

Respective differential amplifier outputs (306, 308) of the differential amplifier are electrically coupled, via respective capacitances (310, 312), to the respective differential amplifier inputs, and the respective differential amplifier inputs are electrically coupled, via respective pairs of electronic switches (314, 316), to respective feedback resistances (318, 320) based on a pair of switch control signals ("add", "sub"). In this regard, based on the pair of switch control signals, a first feedback resistance (320) of the respective feedback resistances is electrically coupled to a first defined reference voltage (e.g., "vrefp") (e.g., 0 volts), and a second feedback resistance (318) of the respective feedback resistances is electrically coupled to a second defined reference voltage (e.g., "vrefn") (e.g., greater than 0 volts).

Alternatively, it should be appreciated that in various embodiment(s) described herein the first defined reference voltage can refer to vrefn, e.g., the first defined reference voltage being greater than 0 volts and applied to feedback resistance 318, and the second defined reference voltage can refer to vrefp, e.g., the second defined reference voltage being equal to 0 volts and applied to the feedback resistance 320.

The differential comparator comprises differential comparator inputs (322, 324) and complementary comparator outputs (326, 328), in which the complementary comparator outputs comprise the pair of switch control signals. Flicker noise is present on, e.g., injected into, the respective differential amplifier inputs if (vrefn+vrefp)/2 (e.g., a reference voltage average) is not equal to, or different from, (vinn+vinp)/2 (e.g., an input voltage average).

Figure 4:
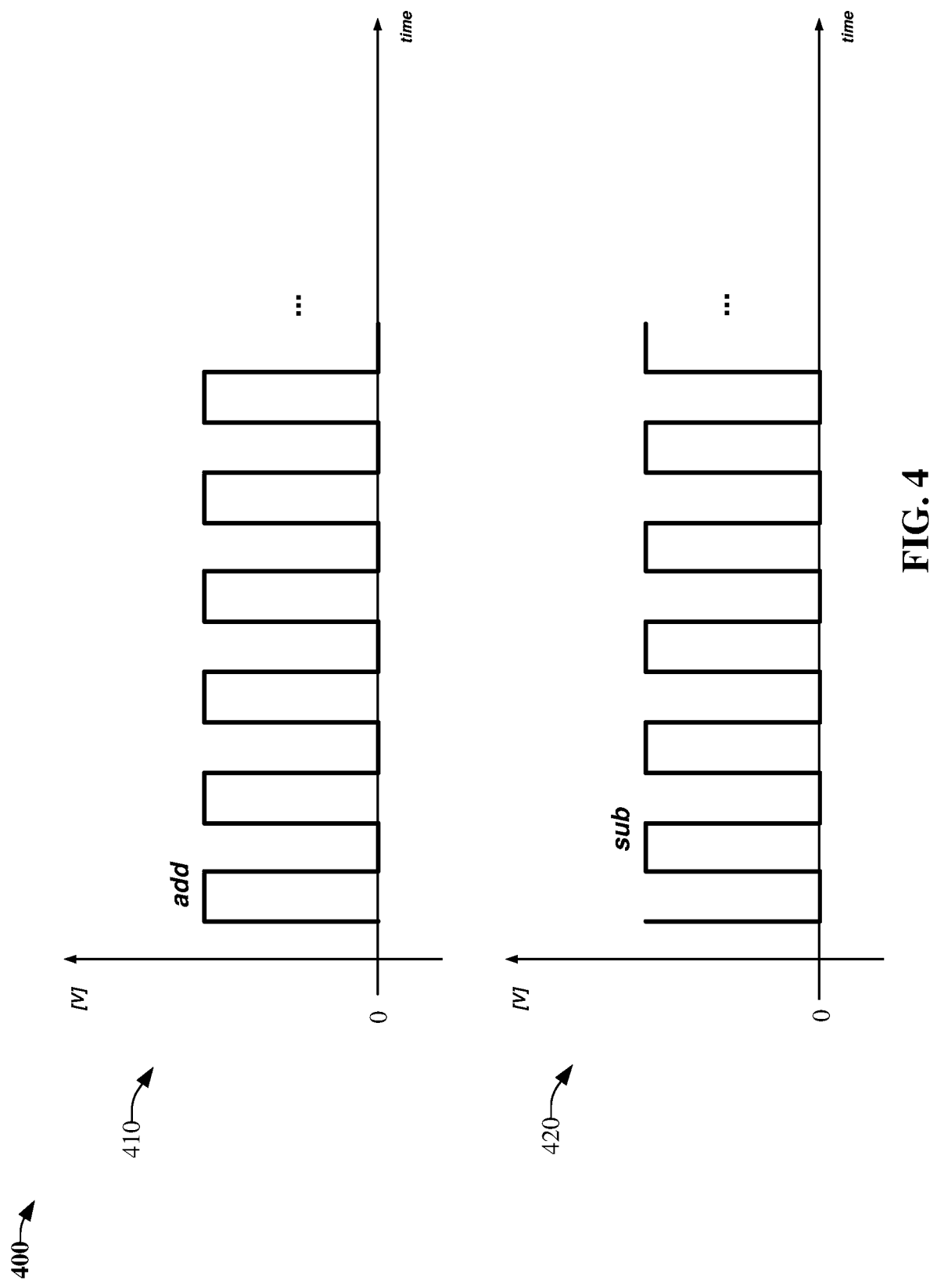
FIG. 4 illustrates waveforms of continuous-time feedback signals applied to a sigma-delta ADC for improved bias instability, in accordance with various example embodiments.

In embodiment(s), bias instability is measured when the differential analog input voltage is equal to 0 V, e.g., vinn=vinp. Under such condition, as illustrated by FIG. 4, the pair of switch control signals comprise respective square-waves (410, 420) that are 180 degrees, or within a defined accuracy of 180 degrees, out of phase with each other, and that have a defined frequency (e.g., orders of magnitude less than a clock frequency of the sigma-delta ADC) and a defined duty cycle that is within a defined accuracy (e.g., 2-5%) of a 50% duty cycle. Since the respective square waves (add, sub) are within the defined accuracy of the 50% duty cycle, and are 180 degrees out of phase with each other, flicker noise currents "Ifp" and "Ifn" that are generated from the respective feedback resistances are equally distributed (as 50% Ifp and 50% Ifn) between the respective differential amplifier inputs ("inn1" and "inp1")—canceling, in average, flicker noise currents between the respective differential amplifier inputs.

In embodiment(s), the complementary comparator outputs are complementary digital output signals. Further, the differential comparator circuit includes a buffer (330) that generates, based on a switch control signal (sub) of the pair of switch control signals, an ADC output signal ("DATA", "SDout") of the sigma-delta ADC.

Figure 5:
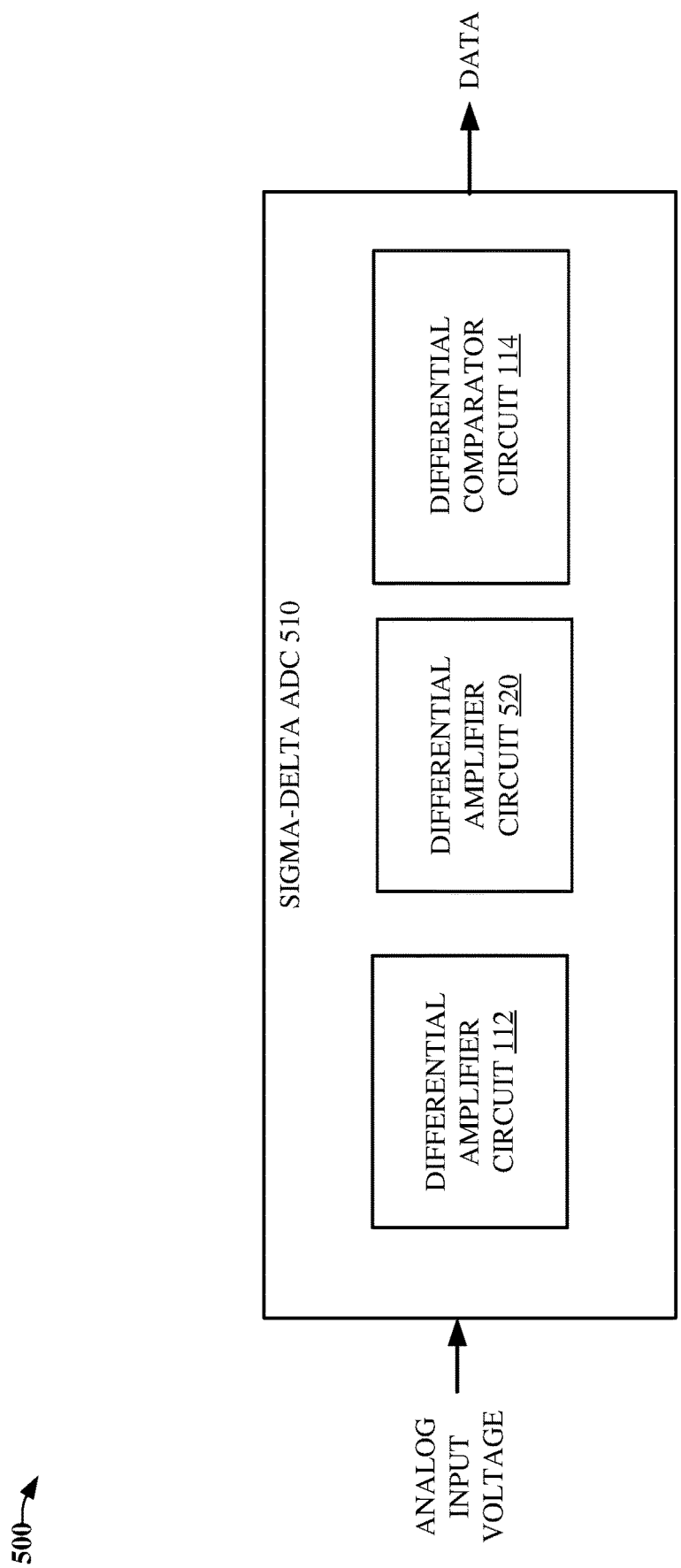
FIG. 5 illustrates a block diagram of a sigma-delta ADC having a pair of differential amplifier circuits and resistive continuous-time DAC feedback for improved bias instability, in accordance with various example embodiments.
Figure 6:
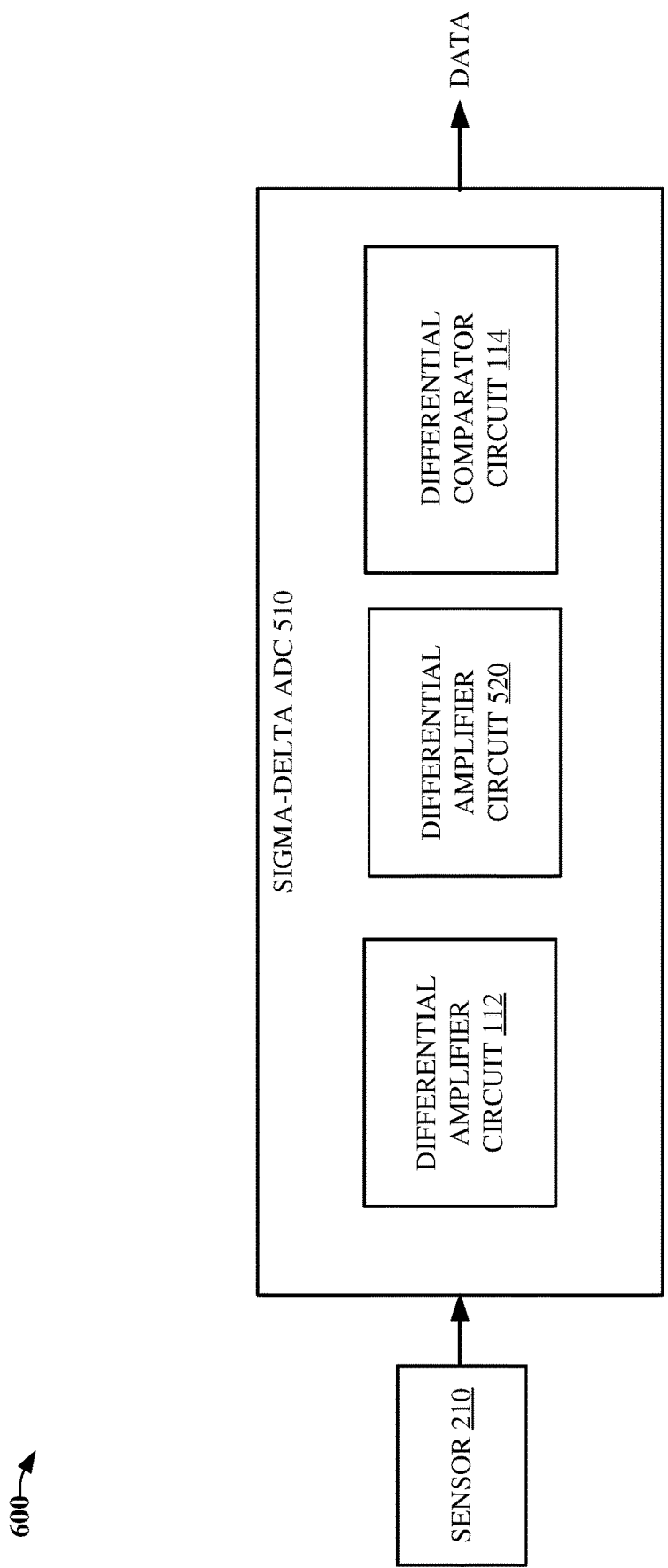
FIG. 6 illustrates a block diagram of a motion sensor-based system utilizing a sensor that is electrically coupled to a sigma-delta ADC having a pair of differential amplifier circuits and resistive continuous-time DAC feedback for improved bias instability, in accordance with various example embodiments.
Figure 7:
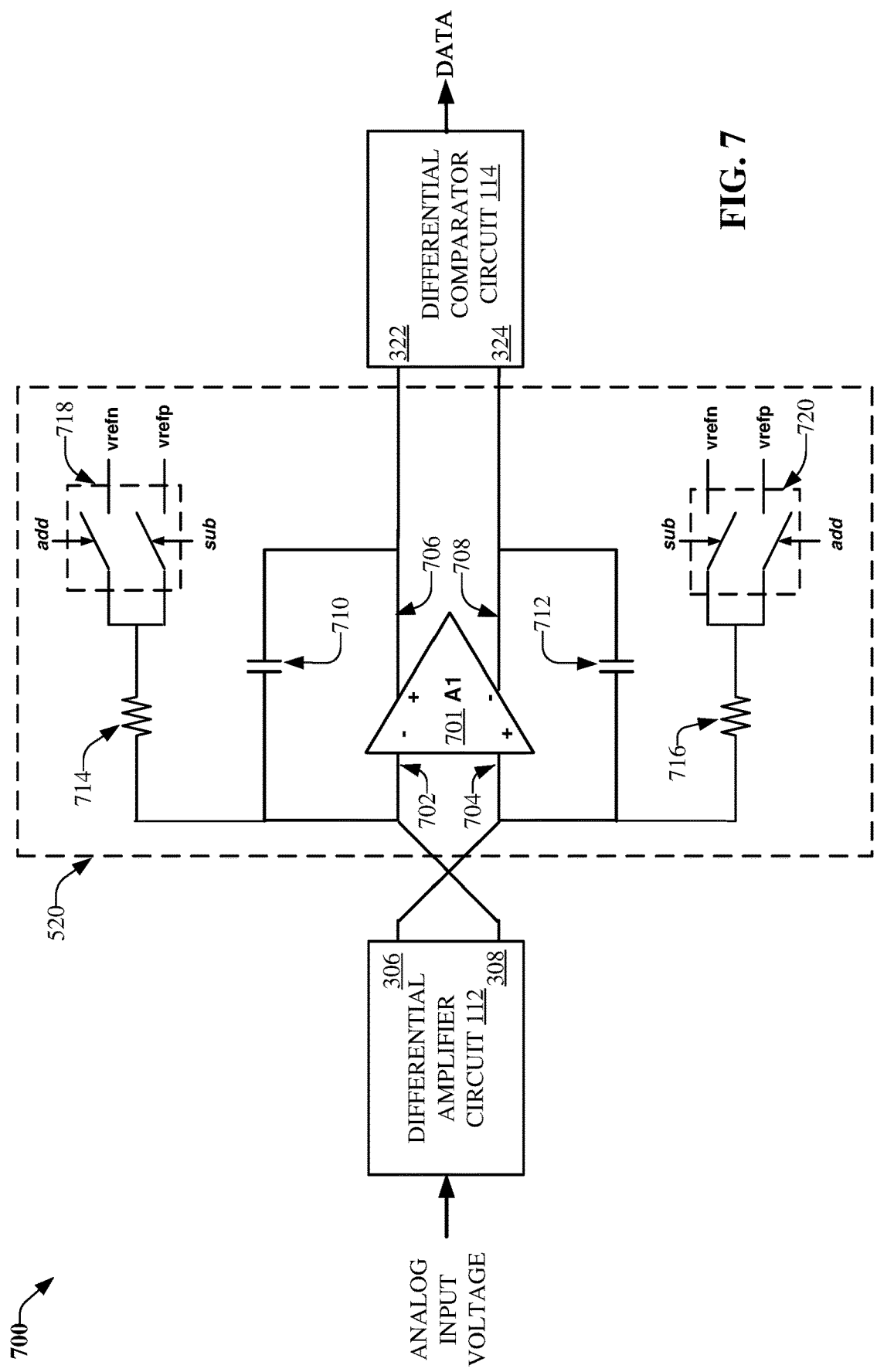
FIG. 7 illustrates a block diagram of a circuit comprising a sigma-delta ADC having a pair of differential amplifier circuits and resistive continuous-time DAC feedback for improved bias instability, in accordance with various example embodiments.

FIGS. 5-7 illustrate block diagrams (500, 600, 700) of a sigma-delta ADC (510) having a pair of differential amplifier circuits (112, 520) and resistive continuous-time DAC feedback for improved bias instability, a motion sensor-based system utilizing a sensor that is electrically coupled to the sigma-delta ADC having a pair of differential amplifier circuits (112, 520) and resistive continuous-time DAC feedback for improved bias instability, and a circuit comprising the sigma-delta ADC having a pair of differential amplifier circuits (112, 520) and resistive continuous-time DAC feedback for improved bias instability, respectively, in accordance with various example embodiments.

The sigma-delta ADC (510) generates, based on an analog input voltage, e.g., generated by a sensor (210) (e.g., motion sensor, MEMS sensor, MEMS based capacitive sensor (e.g., accelerometer based sensor), MEMS based angular rate sensor (e.g., gyroscope based sensor)), a digital output ("DATA") representing a value of the analog input voltage, e.g., representing an acceleration of a system and/or a device including the sigma-delta ADC, representing an angular rotation of the system and/or the device.

Referring now to FIG. 7, differential outputs (306, 308) of a first differential amplifier circuit (112) are electrically coupled to differential amplifier inputs (702, 704) of a differential amplifier (701) of a second differential amplifier circuit (520). In turn, the differential amplifier inputs are electrically coupled, via respective capacitances (710, 712), to respective differential outputs (706, 708) of the differential amplifier. Further, the respective differential amplifier outputs are electrically coupled to differential comparator inputs (322, 324) of a differential comparator circuit (114).

Furthermore, the differential amplifier inputs are electrically coupled, via respective feedback resistances (714, 716), to respective pairs of electronic switches (718, 720), which are electrically coupled, based on the pair of switch control signals, to a first defined reference voltage (e.g., vrefn, e.g., 0 volts) and a second defined reference voltage (e.g., vrefp, e.g., >0 volts).

Alternatively, it should be appreciated that in various embodiment(s) described herein the first defined reference voltage can refer to vrefp (e.g., >0 volts), and the second defined reference voltage can refer to vrefn (e.g., 0 volts).

Figure 8:
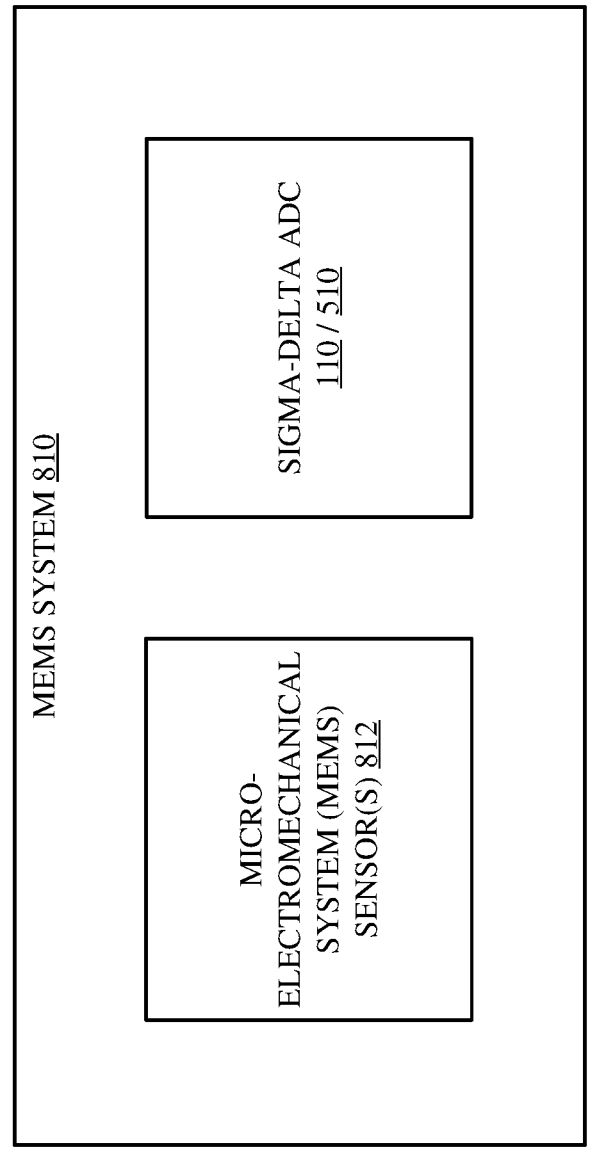
FIG. 8 illustrates a MEMS system including MEMS sensor(s) electrically coupled to a sigma-delta ADC with resistive continuous-time DAC feedback for improved bias instability, in accordance with various example embodiments.

Referring now to embodiment(s) illustrated by FIG. 8, a MEMS system (810) includes MEMS sensor(s) (812), e.g., motion sensor (210), MEMS based capacitive sensor (e.g., accelerometer based sensor), MEMS based angular rate sensor (e.g., gyroscope based sensor). The MEMS sensor(s) generate, based on external excitation(s) of the MEMS sensor(s), respective sensor output signals. Sensor output signals of the respective sensor output signals are electrically coupled, via the respective ADC input resistances, to respective differential amplifier inputs of a differential amplifier of a sigma-delta ADC (110, 510) of the MEMS system. The sigma-delta ADC generates, based on the sensor output signals via the differential amplifier, digital output data representing the external excitation(s), e.g., representing an acceleration of the MEMS system, representing an angular rotation of the MEMS system.

The MEMS system minimizes bias instability, e.g., corresponding to flicker noise that has been injected into the respective differential amplifier inputs of the differential amplifier by respective feedback resistances that are electrically coupled to the respective differential amplifier inputs, by electrically coupling, via respective pairs of electronic switches, the respective differential amplifier inputs to the respective feedback resistances based on a pair of switch control signals. In this regard, the MEMS system equally distributes the flicker noise between the respective differential amplifier inputs, in which a first feedback resistance of the respective feedback resistances is electrically coupled to a first defined voltage, and a second feedback resistance of the respective feedback resistances is electrically coupled to a second defined reference voltage.

In embodiment(s), bias instability is measured when the differential analog input voltage is equal to 0 V, e.g., vinn=vinp. Under such conditions, the pair of switch control signals comprise a defined frequency and a defined duty cycle—the defined duty cycle comprising a defined accuracy with respect to a 50% percent duty cycle.

Figure 9:
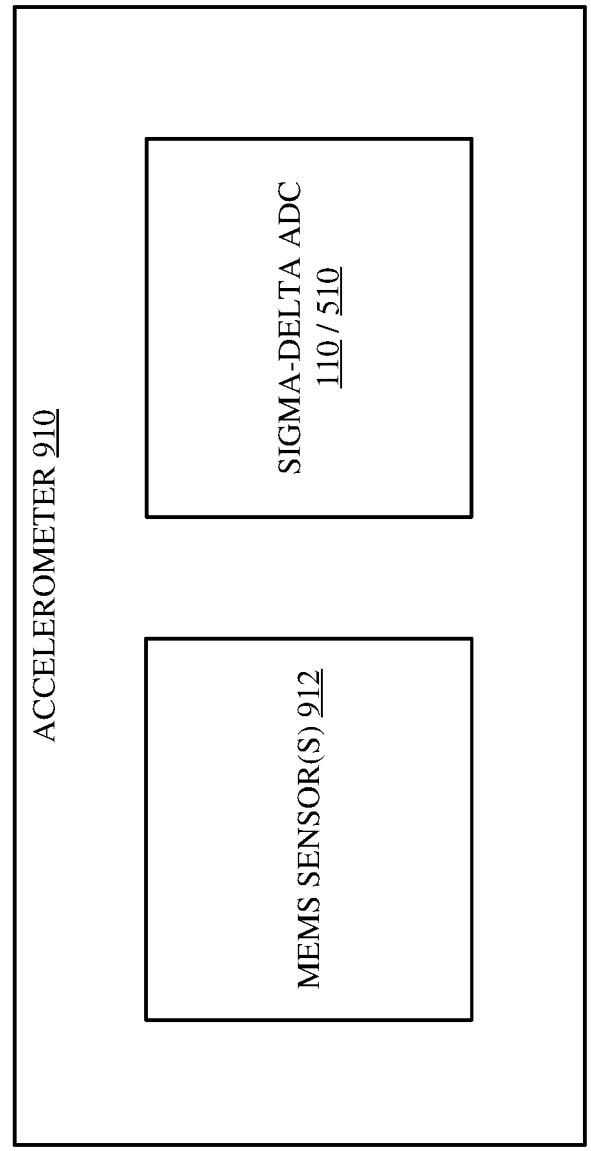
FIG. 9 illustrates an accelerometer including MEMS sensor(s) electrically coupled to a sigma-delta ADC with resistive continuous-time DAC feedback for improved bias instability, in accordance with various example embodiments.

In other embodiment(s) illustrated by FIG. 9, the MEMS system comprises an accelerometer (910) comprising MEMS sensors (912) (e.g., piezoresistive based sensor(s), capacitive based sensor(s)) that are electrically coupled to a sigma-delta ADC (110/510) of the MEMS system. In this regard, the MEMS sensors generate, based on an acceleration that has been applied to the accelerometer, respective sensor output signals. Sensor output signals of the respective sensor output signals are electrically coupled, via respective ADC input resistances of the sigma-delta ADC, to respective differential amplifier inputs of a differential amplifier of the sigma-delta ADC. In turn, the sigma-delta ADC generates, based on the sensor output signals via the differential amplifier, digital output data representing the acceleration of the MEMS system.

In yet other embodiment(s), the accelerometer minimizes bias instability, e.g., corresponding to flicker noise that has been injected into the respective differential amplifier inputs of the differential amplifier by respective feedback resistances that are electrically coupled to the respective differential amplifier inputs, by electrically coupling, via respective pairs of electronic switches, the respective differential amplifier inputs to the respective feedback resistances based on a pair of switch control signals, in which a first feedback resistance of the respective feedback resistances is electrically coupled to a first defined reference voltage, and a second feedback resistance of the respective feedback resistances is electrically coupled to a second defined reference voltage.

Figure 10:
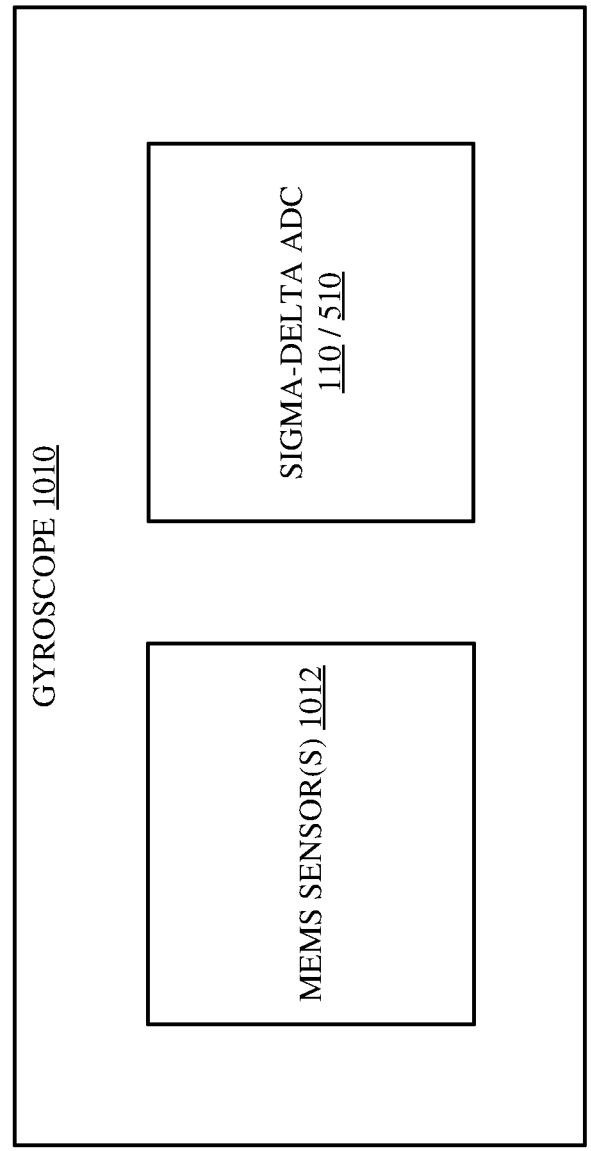
FIG. 10 illustrates a gyroscope including MEMS sensor(s) electrically coupled to a sigma-delta ADC with resistive continuous-time DAC feedback for improved bias instability, in accordance with various example embodiments.

In embodiment(s) illustrated by FIG. 10, the MEMS system comprises a gyroscope (1010) comprising MEMS sensors (1012) (e.g., capacitive based sensor(s), rotational based sensor(s) comprising proof masse(s)) that are electrically coupled to a sigma-delta ADC (110/510) of the MEMS system. In this regard, the MEMS sensors generate, based on an angular rotation that has been applied to the gyroscope, respective sensor output signals. Sensor output signals of the respective sensor output signals are electrically coupled, via respective ADC input resistances of the sigma-delta ADC, to respective differential amplifier inputs of a differential amplifier of the sigma-delta ADC. In turn, the sigma-delta ADC generates, based on the sensor output signals via the differential amplifier, digital output data representing the angular rotation of the MEMS system.

In other embodiment(s), the gyroscope minimizes bias instability, e.g., corresponding to flicker noise that has been injected into the respective differential amplifier inputs of the differential amplifier by respective feedback resistances that are electrically coupled to the respective differential amplifier inputs, by electrically coupling, via respective pairs of electronic switches, the respective differential amplifier inputs to the respective feedback resistances based on a pair of switch control signals, in which a first feedback resistance of the respective feedback resistances is electrically coupled to first defined reference voltage, and a second feedback resistance of the respective feedback resistances is electrically coupled to a second defined reference voltage.

As it employed in the subject specification, the terms ADC device(s), circuit(s), signal(s), modulator(s), filter(s), clock generator(s), clock(s), interface circuit(s), control circuit(s), and/or processing device(s) can refer to substantially any analog and/or digital based device(s), circuit(s), etc. comprising, e.g., a resistor, a capacitor, a transistor, a diode, an inductor, a memory, a programmable device, e.g., fuse, field programmable gate array (FPGA), complex programmable logic device (CPLD), etc. relevant to performing operations and/or functions of circuit(s), device(s), system(s), etc. disclosed herein.

Further, such terms can refer to substantially any computing processing unit or device (e.g., MAC, etc.), comprising, but not limited to comprising, a processor, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an ASIC, a digital signal processor (DSP), an FPGA, a programmable logic controller (PLC), a CPLD, a discrete gate or transistor logic, discrete hardware components, an analog circuit, or any combination thereof designed to perform the functions and/or processes described herein. Further, a processor can exploit nano-scale architectures such as, but not limited to, molecular and quantum-dot based transistors, switches and gates, e.g., in order to optimize space usage or enhance performance of mobile devices. A processor can also be implemented as a combination of computing processing units, devices, etc.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

Furthermore, to the extent that the terms "includes," "has," "contains," and other similar words are used in either the detailed description or the appended claims, such terms are intended to be inclusive—in a manner similar to the term "comprising" as an open transition word—without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Furthermore, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art having the benefit of the instant disclosure.

The above description of illustrated embodiments of the subject disclosure is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A sigma-delta analog-to-digital converter (ADC), comprising:
   a differential amplifier comprising respective differential amplifier inputs and respective differential amplifier outputs, wherein the respective differential amplifier outputs are electrically coupled, via respective capacitances, to the respective differential amplifier inputs, wherein the respective differential amplifier inputs are electrically coupled, based on a pair of switch control signals via respective pairs of electronic switches, to respective feedback resistances, wherein a first feedback resistance of the respective feedback resistances is electrically coupled to a first defined reference voltage, wherein a second feedback resistance of the respective feedback resistances is electrically coupled to a second defined reference voltage that is different from the first defined reference voltage, wherein the sigma-delta ADC minimizes bias instability corresponding to a flicker noise that has been injected into the respective differential amplifier inputs via variations in respective values of the first feedback resistance and the second feedback resistance of the respective, and wherein the flicker noise has been injected into the respective differential amplifier inputs in response to a reference voltage average of the first defined reference voltage and the second defined reference voltage being different from an input voltage average of respective input voltages that have been applied to the respective differential amplifier inputs; and
   a differential comparator comprising differential comparator inputs and complementary comparator outputs, wherein the complementary comparator outputs comprise the pair of switch control signals.

2. The sigma-delta ADC of claim 1, further comprising: respective ADC input resistances, wherein differential input signals of the sigma-delta ADC are electrically coupled, via the respective ADC input resistances, to the respective differential amplifier inputs.

3. The sigma-delta ADC of claim 2, wherein the complementary comparator outputs are complementary digital output signals, and further comprising:
   a buffer, wherein a digital output signal of the complementary digital output signals is electrically coupled to an input of the buffer, and wherein an output of the buffer comprises an ADC output of the sigma-delta ADC.

4. The sigma-delta ADC of claim 3, wherein the differential amplifier is a first differential amplifier, wherein the respective differential amplifier inputs are first respective differential amplifier inputs, wherein the respective differential amplifier outputs are first respective differential amplifier outputs, wherein the respective feedback resistances are first respective feedback resistances, wherein the respective capacitances are first respective capacitances, and further comprising:
   a second differential amplifier comprising second respective differential amplifier inputs and second respective differential amplifier outputs, wherein the first respective differential amplifier outputs are electrically coupled to the second respective differential amplifier inputs, wherein the second respective differential amplifier inputs are electrically coupled, via second respective capacitances, to the second respective differential amplifier outputs, and wherein the second respective differential amplifier outputs are electrically coupled to the differential comparator inputs.

5. The sigma-delta ADC of claim 4, wherein the respective pairs of electronic switches are first respective pairs of electronic switches, wherein the second respective differential amplifier inputs of the second differential amplifier are electronically coupled, via second respective feedback resistances, to second respective pairs of electronic switches, and wherein the second respective pairs of electronic switches are electrically coupled, based on the pair of switch control signals, to the first defined reference voltage and the second defined reference voltage.

6. An accelerometer, comprising:
   a micro-electromechanical system sensor that generates sensor output signals based on an external acceleration that has been applied to the accelerometer; and
   a sigma-delta analog-to-digital converter (ADC), comprising
      respective ADC input resistances, and further comprising,
      a differential amplifier comprising respective differential amplifier inputs and respective differential amplifier outputs, wherein the sensor output signals are electrically coupled, via the respective ADC input resistances, to the respective differential amplifier inputs, wherein the respective differential amplifier outputs are electrically coupled, via respective capacitances, to the respective differential amplifier inputs, wherein the respective differential amplifier inputs are electrically coupled, based on a pair of switch control signals via respective pairs of electronic switches, to respective feedback resistances, wherein a first feedback resistance of the respective feedback resistances is electrically coupled to a first defined reference voltage, wherein a second feedback resistance of the respective feedback resistances is electrically coupled to a second defined reference voltage that is different from the first defined reference voltage, wherein the sigma-delta ADC minimizes bias instability corresponding to a flicker noise that has been injected into the respective differential amplifier inputs via variations in respective values of the first feedback resistance and the second feedback resistance, and wherein the flicker noise has been injected into the respective differential amplifier inputs in response to a reference voltage average of the first defined reference voltage and the second defined reference voltage being different from an input voltage average of respective input voltages that have been applied to the respective differential amplifier inputs, and further comprising, a differential comparator comprising differential comparator inputs and complementary comparator outputs, wherein the respective differential amplifier outputs are electrically coupled to the differential comparator inputs, and wherein the complementary comparator outputs comprise the pair of switch control signals.

7. The accelerometer of claim 6, wherein the complementary comparator outputs are complementary digital output signals, and further comprising:

a buffer, wherein a digital output signal of the complementary digital output signals is electrically coupled to an input of the buffer, and wherein an output of the buffer comprises an ADC output of the sigma-delta ADC.

8. The accelerometer of claim 7, wherein the differential amplifier is a first differential amplifier, wherein the respective differential amplifier inputs are first respective differential amplifier inputs, wherein the respective differential amplifier outputs are first respective differential amplifier outputs, wherein the respective capacitances are first respective capacitances, and further comprising:

a second differential amplifier comprising second respective differential amplifier inputs and second respective differential amplifier outputs, wherein the first respective differential amplifier outputs are electrically coupled to the second respective differential amplifier inputs, wherein the second respective differential amplifier inputs are electrically coupled, via second respective capacitances, to the second respective differential amplifier outputs, and wherein the second respective differential amplifier outputs are electrically coupled to the differential comparator inputs.

9. The accelerometer of claim 8, wherein the respective pairs of electronic switches are first respective pairs of electronic switches, wherein the respective feedback resistances are first respective feedback resistances, wherein the second respective differential amplifier inputs of the second differential amplifier are electrically coupled, via second respective feedback resistances, to second respective pairs of electronic switches, and wherein the second respective pairs of electronic switches are electrically coupled, based on the pair of switch control signals, to the first defined reference voltage and the second defined reference voltage.

10. A gyroscope, comprising:

a micro-electromechanical sensor that generates sensor output signals based on an external rotation that has been applied to the gyroscope; and a sigma-delta analog-to-digital converter (ADC), comprising respective ADC input resistances, and further comprising, a differential amplifier comprising respective differential amplifier inputs and respective differential amplifier outputs, wherein the sensor output signals are electrically coupled, via the respective ADC input resistances, to the respective differential amplifier inputs, wherein the respective differential amplifier outputs are electrically coupled, via respective capacitances, to the respective differential amplifier inputs, wherein the respective differential amplifier inputs are electrically coupled, based on a pair of switch control signals via respective pairs of electronic switches, to respective feedback resistances to minimize bias instability corresponding to a flicker noise that has been injected into the respective differential amplifier inputs via variations in values of the respective feedback resistances, wherein a first feedback resistance of the respective feedback resistances is electrically coupled to a first defined reference voltage, wherein a second feedback resistance of the respective feedback resistances is electrically coupled to a second defined reference voltage that is different from the first defined reference voltage, and wherein the flicker noise has been injected into the respective differential amplifier inputs in response to a reference voltage average of the first defined reference voltage and the second defined reference voltage being different from an input voltage average of respective input voltages that have been applied to the respective differential amplifier inputs, and further comprising, a differential comparator comprising differential comparator inputs and complementary comparator outputs, wherein the respective differential amplifier outputs are electrically coupled to the differential comparator inputs, and wherein the complementary comparator outputs comprise the pair of switch control signals.

11. The gyroscope of claim 10, wherein the complementary comparator outputs are complementary digital output signals, and further comprising:

a buffer, wherein a digital output signal of the complementary digital output signals is electrically coupled to an input of the buffer, and wherein an output of the buffer comprises an ADC output of the sigma-delta ADC.

12. The gyroscope of claim 11, wherein the differential amplifier is a first differential amplifier, wherein the respective differential amplifier inputs are first respective differential amplifier inputs, wherein the respective differential amplifier outputs are first respective differential amplifier outputs, wherein the respective feedback resistances are first respective feedback resistances, wherein the respective capacitances are first respective capacitances, and further comprising:

a second differential amplifier comprising second respective differential amplifier inputs and second respective differential amplifier outputs, wherein the first respective differential amplifier outputs are electrically coupled to the second respective differential amplifier inputs, wherein the second respective differential amplifier inputs are electrically coupled, via second respective capacitances, to the second respective differential amplifier outputs, and wherein the second respective differential amplifier outputs are electrically coupled to the differential comparator inputs.

13. The gyroscope of claim 12, wherein the respective pairs of electronic switches are first respective pairs of electronic switches, wherein the second respective differential amplifier inputs of the second differential amplifier are electrically coupled, via second respective feedback resistances, to second respective pairs of electronic switches, and wherein the second respective pairs of electronic switches are electrically coupled, based on the pair of switch control signals, to the first defined reference voltage and the second defined reference voltage.

14. A system, comprising:
a micro-electromechanical system (MEMS) sensor that generates sensor output signals based on an external excitation of the system; and
a sigma-delta analog-to-digital converter (ADC) comprising
respective ADC input resistances, and further comprising,
a differential amplifier comprising respective differential amplifier inputs and respective differential amplifier outputs, wherein the sensor output signals are electrically coupled, via the respective ADC input resistances, to the respective differential amplifier inputs, wherein the respective differential amplifier outputs are electrically coupled, via respective capacitances, to the respective differential amplifier inputs, wherein the sigma-delta ADC minimizes bias instability corresponding to a flicker noise that has been injected into the respective differential amplifier inputs via variations in values of respective feedback resistances that are electrically coupled to the respective differential amplifier inputs, wherein the sigma-delta ADC minimizes the bias instability by electrically coupling, based on a pair of switch control signals via respective pairs of electronic switches, the respective differential amplifier inputs to the respective feedback resistances, wherein a first feedback resistance of the respective feedback resistances is electrically coupled to a first defined reference voltage, wherein a second feedback resistance of the respective feedback resistances is electrically coupled to a second defined reference voltage that is different from the first defined reference voltage, and wherein the flicker noise has been injected into the respective differential amplifier inputs in response to a reference voltage average of the first defined reference voltage and the second defined reference voltage being different from an input voltage average of respective input voltages that have been applied to the respective differential amplifier inputs, and further comprising
a differential comparator comprising differential comparator inputs and complementary comparator outputs, wherein the respective differential amplifier outputs are electrically coupled to the differential comparator inputs, and wherein the complementary comparator outputs comprise the pair of switch control signals.

15. The system of claim 14, wherein the sigma-delta ADC minimizes the bias instability corresponding to the flicker noise by equally distributing the flicker noise between the respective differential amplifier inputs.

16. The system of claim 14, wherein the complementary comparator outputs are complementary digital output signals, and further comprising:
a buffer, wherein a digital output signal of the complementary digital output signals is electrically coupled to an input of the buffer, and wherein an output of the buffer comprises an ADC output of the sigma-delta ADC.

17. The system of claim 16, wherein the differential amplifier is a first differential amplifier, wherein the respective differential amplifier inputs are first respective differential amplifier inputs, wherein the respective differential amplifier outputs are first respective differential amplifier outputs, wherein the respective feedback resistances are first respective feedback resistances, wherein the respective capacitances are first respective capacitances, and further comprising:
a second differential amplifier comprising second respective differential amplifier inputs and second respective differential amplifier outputs, wherein the first respective differential amplifier outputs are electrically coupled to the second respective differential amplifier inputs, wherein the second respective differential amplifier inputs are electrically coupled, via second respective capacitances, to the second respective differential amplifier outputs, and wherein the second respective differential amplifier outputs are electrically coupled to the differential comparator inputs.

18. The system of claim 17, wherein the respective pairs of electronic switches are first respective pairs of electronic switches, wherein the second respective differential amplifier inputs of the second differential amplifier are electrically coupled, via second respective feedback resistances, to second respective pairs of electronic switches, and wherein the second respective pairs of electronic switches are electrically coupled, based on the pair of switch control signals, to the first defined reference voltage and the second defined reference voltage.

19. The system of claim 14, wherein the system is an accelerometer, and wherein the MEMS sensor generates the sensor output signals based on an external acceleration that has been applied to the accelerometer.

20. The system of claim 14, wherein the system is a gyroscope, and wherein the MEMS sensor generates the sensor output signals based on an external rotation that has been applied to the gyroscope.

* * * * *